United States Patent
Zhang et al.

(10) Patent No.: US 11,455,823 B2
(45) Date of Patent: Sep. 27, 2022

(54) UNDER-SCREEN FINGERPRINT IDENTIFICATION APPARATUS AND ELECTRONIC DEVICE

(71) Applicant: SHENZHEN GOODIX TECHNOLOGY CO., LTD., Shenzhen (CN)

(72) Inventors: Sichao Zhang, Shenzhen (CN); Hao Xie, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 114 days.

(21) Appl. No.: 16/714,697

(22) Filed: Dec. 14, 2019

(65) Prior Publication Data

US 2020/0293738 A1    Sep. 17, 2020

Related U.S. Application Data

(63) Continuation of application No. PCT/CN2019/077855, filed on Mar. 12, 2019.

(51) Int. Cl.

| | |
|---|---|
| *G06V 40/13* | (2022.01) |
| *G02F 1/1335* | (2006.01) |
| *G02F 1/13357* | (2006.01) |
| *G06V 10/145* | (2022.01) |
| *G06V 10/147* | (2022.01) |

(52) U.S. Cl.
CPC .... *G06V 40/1318* (2022.01); *G02F 1/133512* (2013.01); *G02F 1/133606* (2013.01);
(Continued)

(58) Field of Classification Search
CPC .. G06K 9/0004; G06K 9/00013; G06F 3/042; G06F 2203/0338
See application file for complete search history.

(56) References Cited

U.S. PATENT DOCUMENTS

| | | | |
|---|---|---|---|
| 2005/0122418 A1* | 6/2005 | Okita | H01L 31/0232 348/340 |
| 2012/0229422 A1* | 9/2012 | Hwang | G02B 6/0073 345/175 |

(Continued)

FOREIGN PATENT DOCUMENTS

| | | |
|---|---|---|
| CN | 107437047 A | 12/2017 |
| CN | 107480579 A | 12/2017 |

(Continued)

OTHER PUBLICATIONS

Gao Hongjin et al. "LCD and Flat Panel Display Technology," Beijing University of Posts and Telecommunications Press. ISBN: 9787563513970, Jun. 1, 2007, pp. 266-267.

(Continued)

*Primary Examiner* — Yuzhen Shen

(57) ABSTRACT

Embodiments of the present application discloses an under-screen fingerprint identification apparatus, which includes: a micro-lens array, configured to be disposed under the backlight module of the liquid crystal display screen; at least one light shielding layer, disposed under the micro-lens array, wherein the light shielding layer is provided with a plurality of light transmission holes; a photo detecting array, disposed under the light shielding layer; wherein the micro-lens array is configured to converge an optical signal with a specific direction passing through the backlight module to a plurality of light transmission holes, and transmit an optical signal with a non-specific direction passing through the backlight module to a light shielding region of the light shielding layer, wherein the optical signal with the specific direction is transmitted to the photo detecting array through the plurality of light transmission holes.

20 Claims, 6 Drawing Sheets

(52) U.S. Cl.
CPC .......... *G06V 10/145* (2022.01); *G06V 10/147* (2022.01); *G06V 40/1324* (2022.01); *G02F 1/133607* (2021.01)

(56) References Cited

U.S. PATENT DOCUMENTS

| | | | |
|---|---|---|---|
| 2014/0061431 A1 | 3/2014 | Fukagawa et al. | |
| 2016/0020245 A1 | 1/2016 | Fukagawa et al. | |
| 2017/0372114 A1* | 12/2017 | Cho | G01J 1/0233 |
| 2018/0260602 A1 | 9/2018 | He et al. | |
| 2019/0026523 A1 | 1/2019 | Shen et al. | |
| 2019/0228204 A1* | 7/2019 | Park | G09G 3/22 |
| 2020/0226342 A1* | 7/2020 | Lin | G06V 10/147 |

FOREIGN PATENT DOCUMENTS

| | | | | |
|---|---|---|---|---|
| CN | 108446677 A | | 8/2018 | |
| CN | 207833542 U | * | 9/2018 | ............... G06K 9/00 |
| CN | 207833542 U | | 9/2018 | |
| CN | 109299631 A | | 2/2019 | |
| CN | 109409249 A | | 3/2019 | |
| CN | 109416732 A | | 3/2019 | |
| CN | 109416737 A | | 3/2019 | |
| CN | 109983471 A | | 7/2019 | |
| CN | 209496385 U | | 10/2019 | |
| KR | 20190018334 A | | 2/2019 | |
| TW | M575562 U | | 3/2019 | |

OTHER PUBLICATIONS

Xuewen Chen et al. "Imaging method based on the combination of microlens arrays and aperture arrays" Applied Optics. vol. 57, No. 19, 10.1364/A0.57.005392, Jun. 28, 2018, 7 pages total.

Anonymous: "What is prism film?", Jul. 26, 2018, Retrieved from the Internet: URL: https://www.rinalgp.com/info/what-is-prism-film-27613599.html [retrieved on Mar. 31, 2021].

* cited by examiner

UNDER-SCREEN FINGERPRINT IDENTIFICATION APPARATUS AND ELECTRONIC DEVICE

CROSS-REFERENCE TO RELATED APPLICATIONS

This application is a continuation of International Application No. PCT/CN2019/077855, filed on Mar. 12, 2019, the disclosure of which is hereby incorporated by reference in its entirety.

TECHNICAL FIELD

Embodiments of the present application relate to the field of under-screen fingerprint identification, and in particular, to an under-screen fingerprint identification apparatus and an electronic device.

BACKGROUND

With the development of biometric identification technology, the application of under-screen fingerprint identification technology in portable terminals such as mobile phones is becoming more and more widespread. At present, the screen of a mobile phone is mainly classified into a liquid crystal display (LCD) screen and an organic light-emitting diode (OLED) screen according to the type of the light source. Since the OLED screen itself has a property of light transmitting, the OLED under-screen fingerprint identification apparatus can receive the light emitted by the OLED screen itself after being reflected by fingers to detect the fingerprint. While the LCD screen provides a light source through the backlight module, and various film layers in the backlight module have serious interference with the fingerprint optical imaging of the under-screen fingerprint identification apparatus, and cannot meet the commercial standard.

Therefore, how to improve the performance of the LCD under-screen fingerprint identification has become a technical problem to be solved.

SUMMARY

Embodiments of the present application provides an under-screen fingerprint identification apparatus and an electronic device, which could resolve the problem of the impact of LCD backlight module to the fingerprint optical imaging and improve the quality of fingerprint imaging.

In a first aspect, provided is an under-screen fingerprint identification apparatus applicable for electronic devices with a liquid crystal display screen, including:

a micro-lens array, disposed under the backlight module of the liquid crystal display screen;

at least a light shielding layer, disposed under the micro-lens array, wherein the light shielding layer is provided with a plurality of light transmission holes;

a photo detecting array, disposed under the light shielding layer;

wherein the micro-lens array is configured to converge an optical signal with a specific direction passing through the backlight module to the plurality of light transmission holes, and converge an optical signal with a non-specific direction passing through the backlight module to a light shielding region of the light shielding layer, wherein the optical signal with the specific direction is transmitted to the photo detecting array through the plurality of light transmission holes.

By adopting the micro-lens array, the light shielding layer and the plurality of light transmission holes, the technical solution of the embodiment of the present application can perform the optical fingerprint collection by transmitting the optical signal with the specific direction to the photo detecting array, and the optical signal with the non-specific direction can be blocked by the light shielding layer, which could reduce the interference of the optical signal with the non-specific direction after passing through the backlight module on the fingerprint image identification, and improve the fingerprint imaging quality.

In a possible implementation, the optical signal with the specific direction is an optical signal refracted through one of a first prism film side face and a second prism film side face of a prism film in the backlight module;

the optical signal with the non-specific direction includes an optical signal refracted through another of the first prism film side face and the second prism film side face of the prism films in the backlight module;

In a possible implementation, the optical signal with the specific direction is an optical signal of a main optical signal refracted through one of the first prism film side face and the second prism film side face of the prism films in the backlight module;

the optical signal with the non-specific direction includes an optical signal of the main optical signal refracted through another of the first prism film side face and the second prism film side face;

wherein the main optical signal is an optical signal of a main optical signal of a light source reflected by the finger.

In a possible implementation, the optical signal with the non-specific direction further includes an optical signal of a non-main optical signal passing through the first prism film side face and/or the second prism film side face;

wherein the non-main optical signal is an optical signal of a non-main optical signal of the light source reflected by the finger.

In a possible implementation, the micro-lens array includes a plurality of micro-lenses, and the photo detecting array includes a plurality of pixel units;

wherein a first micro-lens of the plurality of micro-lenses is configured to converge a first optical signal above the first micro-lens in the optical signal with the specific direction into a first light transmission hole of the plurality of light transmission holes corresponding to the first micro-lens, and converge a second optical signal above the first micro-lens in the optical signal with the non-specific direction into the light shielding region of the light shielding layer, the first optical signal is transmitted through the first light transmission hole to a first pixel unit of the plurality of pixel units corresponding to the first micro-lens.

In a possible implementation, a direction of a connecting line of a center of the first light transmission hole and a center of the first micro-lens is similar to or same as a direction of the optical signal with the specific direction;

a direction of a connecting line of the center of the first light transmission hole and a center of the first pixel unit is similar to or same as the direction of the optical with the specific direction.

In a possible implementation, the first micro-lens is a polygonal micro-lens or a circular micro-lens, an upper surface of which is a spherical or aspherical surface.

In a possible implementation, the light transmission hole is a circular hole or a polygonal hole.

In a possible implementation, the at least one light shielding layer is packaged on the photo detecting array.

In a possible implementation, the at least one light shielding layer includes a first light shielding layer and a second light shielding layer, and the first light shielding layer is located above the second light shielding layer.

In a possible implementation, a diameter of a light transmission hole of the first light-shielding layer is larger than a diameter of a light transmission hole of the second light-shielding layer.

In a possible implementation, a direction of a connecting line of a center of a light transmission hole of the first light-shielding layer and a center of a corresponding light transmission hole of the second light-shielding layer is similar to or same as a direction of the optical signal with the specific direction.

In a possible implementation, the at least one light shielding layer further includes a third light shielding layer, and the third light shielding layer is located above the first light shielding layer.

In a possible implementation, the under-screen fingerprint identification apparatus further includes:

a filter layer, disposed in an optical path between the backlight module and the photo detecting array, which is configured to filter out an optical signal having non-target band and transmit an optical signal having target band.

In a possible implementation, the under-screen fingerprint identification apparatus further includes:

a transparent medium layer, which is configured to transmit the optical signal and is disposed in at least one of the following regions:

between the micro-lens array and the at least one light shielding layer, in the light transmission hole, between the at least one light shielding layer or between the at least one light shielding layer and the photo detecting array.

In a second aspect, provided is an under-screen fingerprint identification apparatus, including an infrared light source and the under-screen fingerprint identification apparatus of the first aspect or any possible implementation of the first aspect;

wherein the infrared light source is configured to provide an infrared excitation light for fingerprint detection of the under-screen fingerprint identification apparatus, and the infrared excitation light is irradiated to at least part of a display area of the liquid crystal display screen, and the at least part of the display area is at least partially covering a fingerprint detecting area of the fingerprint identification apparatus; wherein the optical signal with the specific direction includes an infrared optical signal with the specific direction of the infrared excitation light of the infrared light source passing through the backlight module after being reflected by a finger, the optical signal with the non-specific direction includes an infrared optical signal with the non-specific direction of the infrared excitation light of the infrared light source passing through the backlight module after being reflected by a finger.

In a possible implementation, the infrared excitation light is a main optical signal of the infrared light source.

In a possible implementation, the infrared light source is disposed under a glass cover of the electronic device and disposed side by side with a liquid crystal panel of the liquid crystal display screen.

In a possible implementation, the infrared light source is obliquely attached to the glass cover.

In a possible implementation, the infrared light source is disposed in a non-display area at an edge of the electronic device.

In a possible implementation, the under-screen fingerprint identification apparatus further includes: an infrared light transmission layer, which is disposed between the infrared light source and the glass cover and/or between the infrared light source and the liquid crystal display screen, and is configured to transmit the infrared excitation light and block a visible light.

In a third aspect, provided is an electronic device, including: a liquid crystal display screen and an under-screen fingerprint identification apparatus of the first aspect or any possible implementation of the first aspect, wherein the liquid crystal display screen includes a backlight module, and the under-screen fingerprint identification apparatus is disposed under the backlight module.

In a possible implementation, the electronic device further includes: an infrared light source, configured to provide an infrared excitation light for fingerprint detection of the under-screen fingerprint identification apparatus, wherein the infrared excitation light is irradiated to at least part of the display area of the liquid crystal display, the at least part of the display area is partially covering the fingerprint detecting area of the under-screen fingerprint identification apparatus;

wherein the optical signal with the specific direction includes an infrared optical signal with the specific direction of the infrared excitation light of the infrared light source passing through the backlight module after being reflected by the finger.

In a possible implementation, the infrared excitation light is the main optical signal of the infrared light source.

In a possible implementation, the infrared light source is disposed under the glass cover of the electronic device and disposed side by side with the liquid crystal panel of the liquid crystal display screen.

In a possible implementation, the infrared light source is obliquely attached to the glass cover.

In a possible implementation, the infrared light source is disposed in a non-display area at an edge of the electronic device.

In a possible implementation, the electronic device further includes: an infrared light transmission layer, which is disposed between the infrared light source and the glass cover and/or between the infrared light source and the liquid crystal display screen, and is configured to transmit the infrared excitation light and block the visible light.

DESCRIPTION OF EMBODIMENTS

Figure 1:
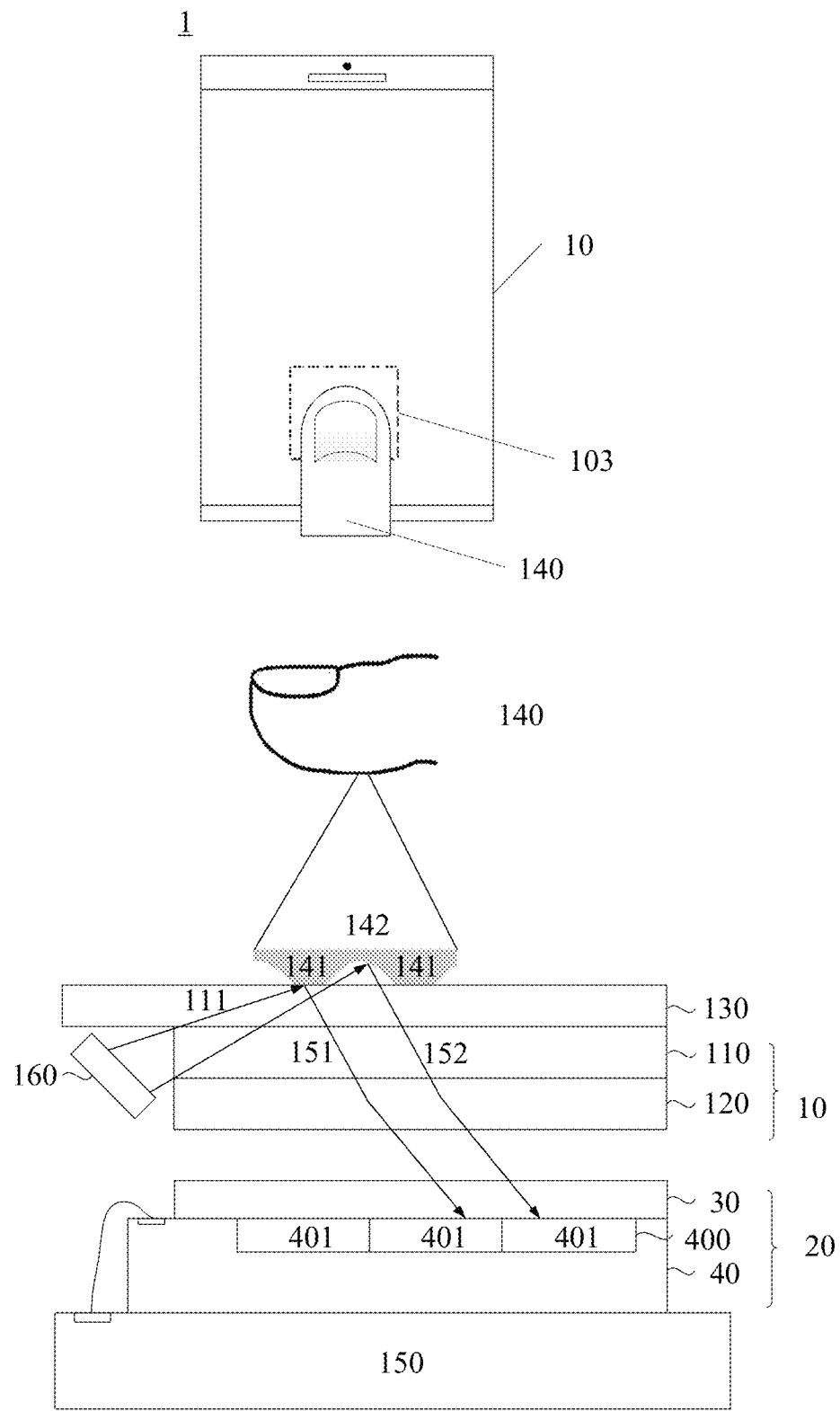
FIG. 1 is a schematic structural view of an electronic device applicable to an embodiment of the present application.

As smart terminal enters the era of full screen, a fingerprint collection area on a front of the electronic device is squeezed by a full screen, so an under-screen (Under-display or Under-screen) fingerprint identification technology is receiving more and more attention. The under-screen fingerprint identification technology refers to mounting the fingerprint identification apparatus (such as a fingerprint identification module) under a display screen, thereby realizing fingerprint identification operation in a display area of the display screen, without setting a fingerprint collection area outside the display area on the front of the electronic device.

The under-screen fingerprint identification technology may include an under-screen optical fingerprint identification technology, an under-screen ultrasonic fingerprint identification technology, or other types of under-screen fingerprint identification technologies.

Taking the under-screen optical fingerprint identification technology as an example, the under-screen optical fingerprint identification technology uses light returned from a top surface of a display component of a device for fingerprint sensing and other sensing operations. The returned light carries information of an object (such as a finger) in touch with the top surface, and a particular optical sensor module located under the display screen is implemented by capturing and detecting the returned light. By properly configuring optical elements capturing and detecting the returned light, a design of the particular optical sensor module can achieve desired optical imaging.

It should be understood that the technical solutions of the embodiments of the present application may be applied to various electronic devices, more specifically, it can be applied to an electronic device having a display screen. such as portable or mobile computing devices like smart phones, notebook computers, tablet computers, game devices, and other electronic devices like electronic databases, automobiles, and bank ATMs (Automated Teller Machine, ATM), but the embodiments of the present application are not limited thereto.

It should also be understood that the technical solutions of the embodiments of the present application may perform other biometric identification in addition to the fingerprint identification, for example, living identification, etc. But the embodiments of the present application are not limited thereto, either.

The technical solutions in the embodiments of the present application will be described below with reference to the accompanying drawings.

It should be noted that, in the embodiments of the present application, the same reference numerals are given to the same components, and the detailed description of the same components is omitted in the different embodiments for the sake of brevity.

It should be understood that the dimensions, length and width, and the like of the various components in the embodiments of the present application shown in the drawings, as well as the overall thickness, length and width of the under-screen fingerprint identification apparatus are merely exemplary descriptions, and should not make any limitation to the present application.

FIG. 1 is a schematic structural view of an electronic device applicable to the embodiments of the present application. The electronic device 1 includes a display screen 10 and an under-screen fingerprint identification apparatus 20, wherein the under-screen fingerprint identification apparatus 20 is disposed in a partial area under the display screen 10. The under-screen fingerprint identification apparatus 20 includes an optical fingerprint sensor, and the optical fingerprint sensor has a photo detecting array 400 having a plurality of pixel units 401, an area where the photo detecting array 400 is located or the sensing area thereof is a fingerprint detecting area 103 of the under-screen fingerprint identification apparatus 20. As shown in FIG. 1, the fingerprint detecting area 103 is located in the display area of the display screen 10. In an alternative embodiment, the under-screen fingerprint identification apparatus 20 may also be disposed at other locations, such as a side of the display screen 10 or the marginal non-transmissive region of the electronic device 1, and by designing the optical path, an optical signal in at least a part of the display area of the display screen 10 is directed to the under-screen fingerprint identification apparatus 20, such that the fingerprint detecting area 103 is actually located in the display area of the display screen 10.

It should be understood that an area of the fingerprint detecting area 103 may be different from an area of a sensing array of the under-screen fingerprint identification apparatus 20, for example, by optical path design such as lens imaging, reflective folding optical path design, or other light convergence or reflection optical design, such that the area of the fingerprint detecting area 103 of the under-screen fingerprint identification apparatus 20 is larger than the area of the sensing array of the under-screen fingerprint identification apparatus 20. In other alternative implementations, if an optical path guidance is performed by using, for example, a light collimation method, the area of the fingerprint detecting area 103 of the under-screen fingerprint identification apparatus 20 can also be designed to be substantially the same as the area of the sensing array of the under-screen fingerprint identification apparatus 20.

Therefore, when the user needs to unlock the electronic device or perform other fingerprint verification, a fingerprint input operation may be implemented merely by pressing a finger on the fingerprint detecting area 103 located in the display screen 10. Since the fingerprint detection can by implemented under a screen, there is no need to reserve space on the front side of the electronic device adopting the foregoing structure to set a fingerprint button (such as a Home button), so that a full screen solution can be adopted, that is the display area of the display screen 10 can be substantially extended to the entire front surface of the electronic device 1.

As an alternative implementation, as shown in FIG. 1, the under-screen fingerprint identification apparatus 20 includes an optical component 30 and a light detecting portion 40, the light detecting portion 40 includes the photo detecting array 400, a reading circuit and other auxiliary circuits connected electrically with the photo detecting array, by semiconductor process, the light detecting portion 40 may be fabricated on a die, such as an optical imaging die or an optical fingerprint sensor, and the sensing array is specifically a photo detector array, which includes a plurality of photo detectors distributed in an array, the photo detectors can be used as the pixel units described above; the optical component 30 can be disposed above the sensing array of the light detecting portion 40.

In a specific implementation, the optical component 30 can be packaged in a same optical fingerprint component with the light detecting portion 40. For example, the optical component 30 may be packaged in a same optical fingerprint die with the light detecting portion 40, or the optical component 30 may be disposed outside the die where the light detecting portion 40 is located, for example, the optical component 30 is attached above the die, or part of the elements of the optical component 30 are integrated into the die.

It should be understood that, in a specific implementation, the electronic device 1 further includes a transparent protective cover 130; the cover may be a glass cover or a sapphire cover, which is located above the display screen 10 and covers a front surface of the electronic device 1. Therefore, in an embodiment of the present application, the so-called pressing the display screen 10 by a finger may actually refer to pressing the cover above the display screen 10 or covering a surface of the protective layer of the cover.

On the other hand, in some embodiments, the under-screen fingerprint identification apparatus 20 may include only one optical fingerprint sensor, at this time, the fingerprint detecting area 103 of the under-screen fingerprint identification apparatus 20 has a small area and a fixed position, so the user's finger needs to press to a specific position of the fingerprint detecting area 103 when the fingerprint input is performed, otherwise, the fingerprint identification apparatus 20 may not collect the fingerprint image and cause a poor user experience. In other alternative embodiments, the under-screen fingerprint identification apparatus 20 may specifically include a plurality of optical fingerprint sensors; the plurality of optical fingerprint sensors may be disposed side by side in a splicing manner under the display screen 10, and the sensing area of the plurality of the optical fingerprint sensors constitute the fingerprint detecting area 103 of the under-screen fingerprinting apparatus 20 together. That is to say, the fingerprint detecting area 103 of the under-screen fingerprint identification apparatus 20 may include a plurality of sub-areas, each of which corresponds to a sensing area of one of the optical fingerprint sensors, thereby the fingerprint detecting area 103 of the optical fingerprint module 130 can be extended to a main area of a lower half of the display screen, that is, to the customary finger pressing area, thereby implementing a blind-type fingerprint input operation. Alternatively, when the number of the optical fingerprint sensors is sufficient, the fingerprint detecting area 103 can also be expanded to half of the display area or even the entire display area, thereby implementing half screen or full screen fingerprint detection.

It should be understood that a circuit board 150, such as a flexible printed circuit (FPC), may be disposed under the under-screen fingerprint identification apparatus 20. The under-screen fingerprint identification apparatus 20 can be adhered to the circuit board 150 by adhesive, and implement the electrical connection to the circuit board 150 through a soldering pad and wire soldering. The optical fingerprint identification apparatus 20 can implement electrical interconnection and signal transmission with other peripheral circuits or other elements of the electronic device 1 by the circuit board 150. For example, the under-screen fingerprint identification apparatus 20 may receive a control signal of a processing unit of the electronic device 1 through the circuit board 150, and may also output a fingerprint detecting signal from the under-screen fingerprint identification apparatus 20 to the processing unit, a control unit or the like of the electronic device 1 through the circuit board 150.

It should be noted that the optical fingerprint apparatus in the embodiment of the present application may also be referred to as an optical fingerprint identification module, a fingerprint identification apparatus, a fingerprint identification module, a fingerprint module and a fingerprint collection apparatus, etc., and the terms may be replaced with each other.

It should be noted that when the display screen 10 is a display screen having a self-emitting display unit, for example, an organic light-emitting diode (OLED) display screen or a micro light-emitting diode (micro-LED) display screen. Taking a display screen adopting an OLED display screen as an example, the under-screen fingerprint identification apparatus 20 can utilize an OLED display unit (that is, an OLED light source) located in the fingerprint detecting area 103 of the OLED display screen 10 as an excitation light source for optical fingerprint identification. The display screen 10 emits a beam of light to a target finger 140 above the fingerprint detecting area 103, and the light is reflected on a surface of the finger 140 to form a reflected light or scattered through the inside of the finger 140 to form a scattered light. In related patent applications, for the convenience of description, the above reflected light and scattered light are collectively referred to as a reflected light. Since a ridge and a valley of the fingerprint have different light reflecting ability, the reflected light from the fingerprint ridge and that from the fingerprint valley have different light intensities, after passing through the optical component 30, the reflected light is received by the photo detecting array 400 in the under-screen identification apparatus 20 and converted into a corresponding electrical signal, that is, a fingerprint detecting signal; based on the fingerprint detecting signal, fingerprint image data can be obtained, and fingerprint matching verification can be further performed, thereby the optical fingerprint identification function can be implemented by the electronic device 1.

When the display screen 10 is a display screen without a self-emitting display unit, for example, a liquid crystal display or other passive light-emitting display, a backlight module is required as the light source of the display screen 10. Taking the liquid crystal display screen having a backlight module and a liquid crystal panel as an example, in order to support the under-screen fingerprint detection of the liquid crystal display screen, as shown in FIG. 1, the display screen 10 includes the liquid crystal panel 110 and the backlight module 120, the backlight module is configured to emit an optical signal to the liquid crystal panel, and the liquid crystal panel 110 includes a liquid crystal layer and a control circuit for controlling deflection of the liquid crystal to transmit the optical signal. The electronic device 1 may further include an excitation light source 160 for optical fingerprint detection, the under-screen fingerprint identification apparatus 20 is disposed under the backlight module 120, when the finger 140 presses in the fingerprint detecting area 103, the excitation light source 160 emits an excitation light 111 to the target finger 140 above the fingerprint detecting area 103, and the excitation light 111 is reflected on a surface of the finger 140 to form a first reflected light 151 of the fingerprint ridge 141 and a second reflected light 152 of the fingerprint valley 142, after the first reflective light 151 and the second reflected light 152 pass through the liquid crystal panel 110 and the backlight module 120, and then pass through the optical component 30, the first reflective light 151 and the second reflected light 152 are received by the photo detecting array 400 in the fingerprint identification apparatus 20 and converted into the fingerprint detecting signal.

Figure 2:
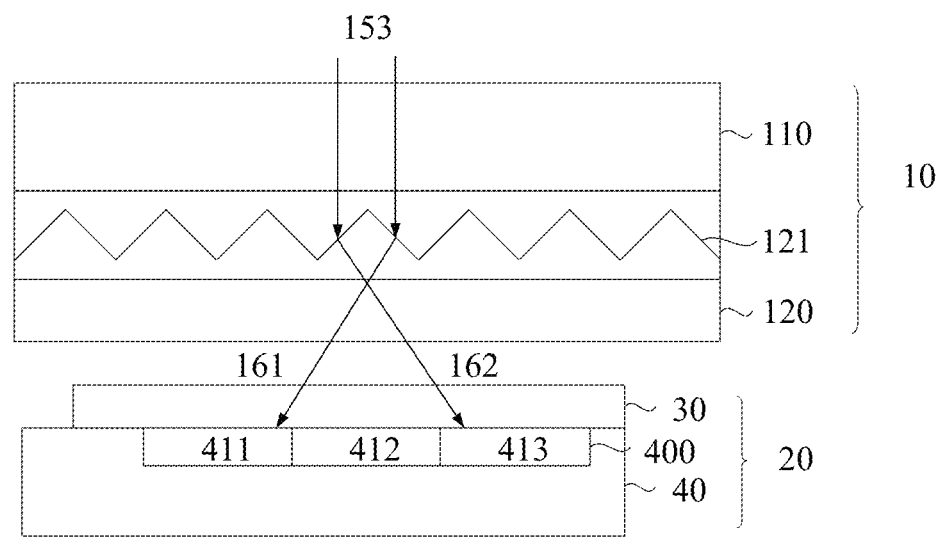
FIG. 2 is a schematic structural view of an under-screen fingerprint identification apparatus according to an embodiment of the present application.

In this process, since a film layer such as a prism film exists in the backlight module 120, the prism film refracts a third reflected light 153 formed by the reflection of the finger, as shown in FIG. 2, the third reflected light 153 is vertically irradiated at the backlight module 120, and the third reflected light 153 is refracted into a first refracted light 161 and a second refracted light 162 which have different directions, and the first refracted light 161 and the second refracted light 162 are simultaneously received by a first receiving pixel unit 411 and a third receiving pixel unit 413 in different regions of the light detecting portion 40, and a second receiving pixel unit 412 corresponding to the third reflected light 153 cannot receive an optical signal, therefore, center of the fingerprint image detected by the light detecting portion 40 forms a dark strip, and part of the image may create double image, resulting in serious field loss and distortion.

Hereinafter, in combination with FIG. 3 to FIG. 6, an under-screen fingerprint identification apparatus of an embodiment of the present application is described in detail, which can receive a light in a specific direction range after passing through the LCD backlight module, and improve the imaging quality of the LCD under-screen fingerprint identification.

Figure 3:
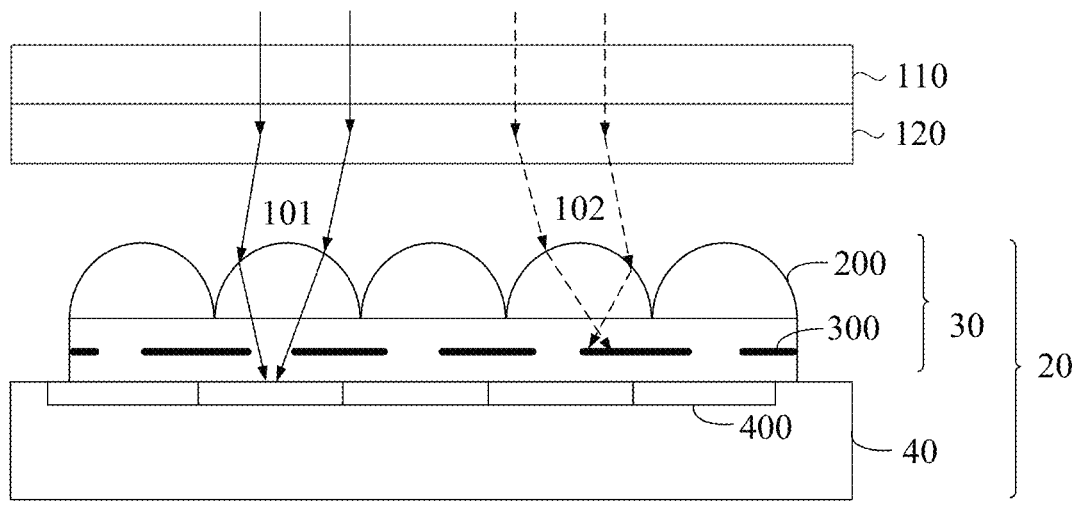
FIG. 3 is another schematic structural view of an under-screen fingerprint identification apparatus according to an embodiment of the present application.

FIG. 3 is a schematic structural view of an under-screen fingerprint identification apparatus 20 according to an embodiment of the present application, which is applicable for an electronic devices with liquid crystal display screen.

As shown in FIG. 3, the under-screen fingerprint identification apparatus 20 may include:

a micro-lens array 200, configured to be disposed under the backlight module 120 of the liquid crystal display screen 10;

at least one light shielding layer 300, disposed under the micro-lens array 200, wherein the light shielding layer 300 is provided with a plurality of light transmission holes 310;

a photo detecting array 400, disposed under the light shielding layer 300;

wherein the micro-lens array 200 is configured to converge an optical signal with a specific direction passing through the backlight module 120 to the plurality of light transmission holes 310, and transmit an optical signal with a non-specific direction passing through the backlight module to the light shielding region of the light shielding layer 300, wherein the optical signal with the specific direction is transmitted to the photo detecting array 400 through the plurality of light transmission holes 310.

Specifically, the optical signal with the specific direction and the optical signal with the non-specific direction are optical signals that pass through the backlight module 120 after being reflected by the finger.

Alternatively, the optical component 30 in FIG. 1 may include the micro-lens array 200 and the light shielding layer 300 described above.

Optionally, the optical signal with the specific direction may be one or more optical signals with the specific direction. The optical signal with the non-specific direction is a set of optical signals having different directions from the optical signal with the specific direction.

Optionally, the optical signal with the specific direction may be an optical signal, of which an incident direction is perpendicular to the under-screen fingerprint identification apparatus 20, or as shown in FIG. 3, the optical signal with the specific direction may be a first optical signal 101 with a specific angle, of which the incident direction is not perpendicular to the under-screen fingerprint identification apparatus 20.

Optionally, the optical signal with the non-specific direction may include one or more optical signals with the non-specific direction, optionally, as shown in FIG. 3, the optical signal with the non-specific direction may include a second optical signal 102 with a specific angle, of which an incident direction is not perpendicular to the under-screen fingerprint identification apparatus 20.

Specifically, the optical signal with the non-specific direction is an optical signal that interferes with the optical fingerprint imaging of the optical signal with the specific direction.

Optionally, the optical signal with the specific direction may be an optical signal refracted through one of a first prism film side face and a second prism film side face of a prism films 121 in the backlight module 120.

The optical signal with the non-specific direction includes an optical signal refracted through another of the first prism film side face and the second prism film side face in the backlight module.

Figure 4:
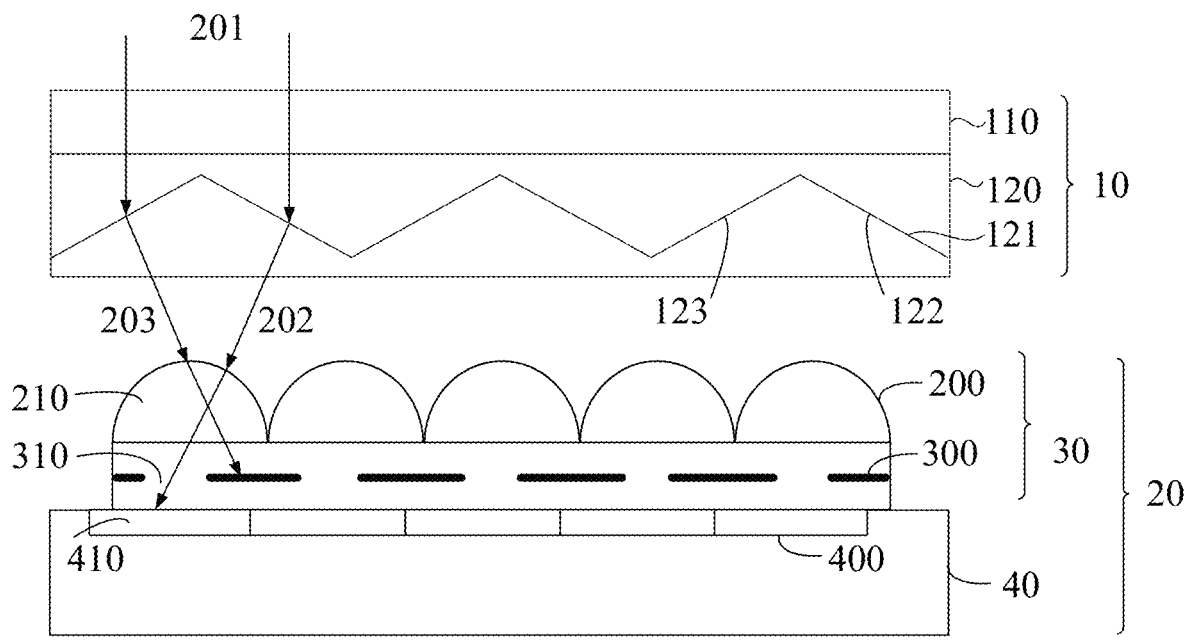
FIG. 4 is another schematic structural view of an under-screen fingerprint identification apparatus according to an embodiment of the present application.

As shown in FIG. 4, the backlight module 120 includes the prism film 121, which includes a plurality of prism film units whose surfaces are composed of a first prism film side face 122 and a second prism film side face 123. Each of the prism film units includes a corresponding first prism film side face unit and a second prism film side face unit. Optionally, a plurality of the first prism film side face units are parallel to each other, and a plurality of the second prism film side face units are parallel to each other.

Optionally, the optical signal with the specific direction may be an optical signal of a main optical signal refracted through one of the prism film side face and the second prism film side face of the prism films in the backlight module;

the optical signal with the non-specific direction includes an optical signal of the main optical signal refracted through another of the first prism film side face and the second prism film side face;

wherein the main optical signal is an optical signal of a main optical signal of the light source reflected by the finger. The main optical signal of the light source is an optical signal of the light source having a main light emitting direction. For example, the main light emitting direction of the light source is a direction of a connecting line between a center of the light source and a center of a target of the light source, and the main optical signal of the light source is an optical signal having a same direction with the direction of the connecting line between the center of the light source and the center of the target.

Optionally, the light source is disposed obliquely under the finger, and the light source obliquely illuminates at a surface of the finger, the main light emitting direction of the light source is a light emitting direction of a connecting line between the center of the light source and a center of a finger surface, and the main optical signal of the light source is an optical signal having a same direction with a direction of a connecting line between the center of the light source and the center of the finger surface. The main optical signal is an optical signal, of which an incident direction is not perpendicular to the backlight module.

Optionally, the light source is disposed directly under the finger, and the light source illuminates the surface of the finger from the front, and a connecting line between the center of the light source and the center of the finger surface is perpendicular to the surface of the finger, and the main light emitting direction of the light source is perpendicular to the surface of the finger. The main optical signal of the light source is an optical signal, of which an emitting direction is perpendicular to the surface of the finger, and the main optical signal is an optical signal, of which an incident direction is perpendicular to the backlight module.

For example, as shown in FIG. 4, the main optical signal 201 is a beam of optical signal that reflected by the finger, of which an incident direction is perpendicular to the backlight module 120, and the main optical signal 201 is refracted at the first prism film side face 122 to generate a first refracted optical signal 202, and the main optical signal 201 is refracted at the second prism film side face 123 to generate a second refracted optical signal 203, the optical signal with the specific direction is an optical signal having a same direction with the first refracted optical signal 202, the optical signal with the non-specific direction includes an optical signal that is in the same direction as the second refracted optical signal 203.

Alternatively, the optical signal with the specific direction is an optical signal having a same direction with the second refracted optical signal 203, the optical signal with the non-specific direction includes an optical signal that is in the same direction as the first refracted optical signal 202.

Optionally, the optical signal with the specific direction may further include a plurality of optical signals refracted through one of the first prism film side face and the second prism film side face of the prism films 121 in the backlight module 120.

For example, the optical signal with the specific direction includes an optical signal of a main optical signal and a non-main optical signal refracted through the first prism film side face 122 or the second prism film side face 123, and the non-main optical signal is an optical signal of the non-main optical signal of the light source after being refracted by the finger. The non-main optical signal of the light source is an optical signal having a different direction with the main optical signal of the light source. Optionally, directions of the non-main optical signal and the main optical signal are similar with each other, for example, the non-main optical signal includes an optical signal having an angle difference within ±1° from a direction of the main optical signal.

As a possible implementation, as shown in FIG. 4, the optical signal with the specific direction includes the first refracted optical signal 202. The first refracted optical signal 202 can pass through the light transmission hole on the light shielding layer 300 and be received by the photo detecting array 400. The optical signal with the non-specific direction includes the second refracted optical signal 203. The second refracted optical signal 203 is blocked by the light shielding region on the light shielding layer 300 and cannot be received by the photo detecting array 400.

In the embodiment of the present application, a direction of the first refracted optical signal 202 refracted by the first prism film side face 122 and a direction of the second refracted optical signal 203 refracted by the second prism film side face 123 of the prism film 121 are related to an angle between the first prism film side face 122 and the second prism film side face 123.

It should be understood that the backlight module may further include a plurality of the prism films, although the above description is made by taking a prism film as an example, the technical solution of the embodiment of the present application is not limited to a prism film. For the case of a plurality of prism films, the technical solution described above is applied to each layer of the prism film.

Optionally, an upper surface of the micro-lens array 200 is a light converging area, and the light converging area covers a photosensitive area of the photo detecting array 400. Specifically, the upper surface of the micro-lens array 200 is an array spliced by a plurality of spherical or aspherical surfaces, all of which are curved surfaces and do not include a plane, and light can be converged in all regions on the upper surface of the micro-lens array 200. The photosensitive area in the photo detecting array 400 is an area that can receive an optical signal, for example, the photo detecting array 400 is a pixel array in a photoelectric sensor, and the photosensitive area of the photo detecting array 400 is the pixel array area in the photoelectric sensor.

Optionally, as shown in FIG. 4, the micro-lens array 200 includes a plurality of micro-lenses, and the photo detecting array 400 includes a plurality of pixel units. Wherein a first micro-lens 210 of the plurality of micro-lenses is configured to converge a first optical signal above the first micro-lens in the optical signal with the specific direction into the first light transmission hole 310 of the plurality of light transmission holes corresponding to the first micro-lens 210, and converge a second optical signal above the first micro-lens 210 in the optical signal with the non-specific direction into the light shielding region of the light shielding layer 300, the first optical signal is transmitted through the first light transmission hole 310 to the first pixel unit 410 of the plurality of pixel units corresponding to the first micro-lens.

For example, as shown in FIG. 4, the first optical signal is an optical signal above the first micro-lens 210, which has a same direction with the first refracted optical signal 202. The first micro-lens 210 converges the first refracted optical signal 202 to the first light transmission hole 310, and the first refracted optical signal 202 is transmitted to the first pixel unit 410 through the first light transmission hole 310. The second optical signal is an optical signal above the first micro-lens 210, which has a same direction with the second refracted optical signal 203. The first micro-lens 210 converges the second refracted optical signal 203 to the light shielding region of the light shielding layer 300, and the second refracted optical signal 203 is blocked by the light shielding layer 300 and cannot be received by the photo detecting array 400.

Optionally, a surface of the first micro-lens 210 may be spherical or aspherical.

Optionally, the first micro-lens 210 is a polygonal lens, such as a square lens or a hexagonal lens, optionally, the first micro-lens 210 may also be a circular lens. Preferably, the first micro-lens 210 is a quadrilateral lens, of which an upper surface is a spherical surface and a lower surface is a quadrilateral micro-lens.

Optionally, a material of the first micro-lens array 200 is a transparent medium having a light transmittance greater than 99%, such as a resin and the like.

It should be understood that the first micro-lens 210 is any one of the plurality of micro-lenses in the micro-lens array 200, a specific position of the first micro-lens 210 in the micro-lens array 200 is not limited by the embodiment of the present application.

It should be understood that a shape and size of the plurality of micro-lenses in the micro-lens array 200 may be the same as or different from that of the first micro-lens 210, the shape and size of the plurality of micro-lenses are not limited in the embodiment of the present application.

Optionally, each of the plurality of micro-lenses in the micro-lens array 200 is the same as the first micro-lens 210, for example, each micro-lens in the micro-lens array 200 is a quadrilateral micro-lens, the plurality of quadrilateral micro-lenses are arranged in an array on a horizontal plane.

In addition, each micro-lens in the micro-lens array 200 may also be a circular micro-lens or other polygonal micro-lens.

In the embodiment of the present application, the optical signal with the specific direction is transmitted to the photo detecting array 400 through the plurality of light transmission holes on the light shielding layer 300. The light shielding layer 300 is configured to block the optical signal with the non-specific direction, such as an ambient light, a stray light, and the like that interferes with the fingerprint detection.

For example, the light shielding layer 300 has a light transmittance less than 20% for light having a specific wavelength band (such as a visible light or a light with a wavelength band more than 610 nm), such that a corresponding light is prevented from passing. Optionally, a material of the light shielding layer 300 may be metal and/or black opaque material.

Optionally, the first light transmission hole 310 is a circular hole having a diameter less than 10 μm which enables the optical imaging, and by reducing a size of the light transmission hole, a resolution of the optical imaging can be improved, thereby improving a resolution of the fingerprint image.

Optionally, the diameter of the first light transmission hole 310 is greater than a certain threshold, such that sufficient unit optical signal can pass through to perform the imaging and improve the imaging quality.

Optionally, a shape of the first light transmission hole 310 may also be a polygon, which is not limited in the embodiment of the present application.

It should be understood that a shape and size of each light transmission hole on the light shielding layer 300 may be the same as or different from that of the first light transmission hole 310, which is not limited by the embodiment of the present application.

Optionally, each of the light transmission holes on the light-shielding layer 300 has the same shape and size as the first light transmission hole 310, and positions of the plurality of light transmission holes are arranged in an array, and each of the light transmission holes corresponds to a micro-lens.

In the embodiment of the present application, the optical signal with the specific direction is transmitted to the photo detecting array 400 through the plurality of light transmission holes on the light shielding layer 300, the optical signal with the non-specific direction is blocked by the light shielding region on the light shielding layer 300 and cannot be received by the photo detecting array 400, the photo detecting array 400 is configured to receive the optical signal with the specific direction and convert it into an electric signal. Optionally, the photo detecting array further processes the electrical signal to obtain a fingerprint image signal.

Optionally, as shown in FIG. 3 and FIG. 4, the photo detecting array 400 includes a plurality of pixel units, and the plurality of pixel units include a first pixel unit 410 corresponding to the first micro-lens 210, the first optical signal is transmitted to the first pixel unit 410 through the first light transmission hole 310.

Optionally, the first pixel unit 410 is further configured to process the first optical signal to obtain a first fingerprint image electrical signal, where the first fingerprint image electrical signal is a unit pixel in the fingerprint image.

Optionally, the first pixel unit 410 may adopt a device such as a photo diode, a metal oxide semiconductor field effect transistor (MOSFET), or the like. Optionally, the first pixel unit 410 has higher light sensitivity and quantum efficiency for light having a specific wavelength in order to detect an optical signal with corresponding wavelength.

Optionally, a shape of the first pixel unit 410 may also be a polygon, the shape of the first pixel unit 410 is not limited in the embodiment of the present application.

It should be understood that a shape and size of each of the pixel units on the photo detecting array 400 may be the same as or different from that of the first pixel unit 410, which is not limited by the embodiment of the present application.

Optionally, a shape of the first pixel unit 410 is a quadrangle, and a shape of each pixel unit in the photo detecting array 400 may be the same as that of the first pixel unit 410, that is a quadrangle, and the pixel units are arranged in an array, and each pixel unit corresponds to a first micro-lens.

Optionally, the photo detecting array 400 is in the photoelectric sensor, wherein the plurality of pixel units are a plurality of pixel units in the photoelectric sensor, and specifically, the photo detecting array 400 may be a separately packaged photoelectric sensor die.

Optionally, the light shielding layer 300 may be packaged in the photoelectric sensor die together with the photo detecting array 400, specifically, the photo detecting array 400 includes a plurality of pixel units in the photoelectric sensor prepared by a semiconductor process, the light shielding layer 300 can be prepared on the plurality of pixel units in the photoelectric sensor by adopting a micro-nano machining process or a nano printing process, for example, by adopting a micro-nano machining process, such as atomic layer deposition, sputter coating, electron beam evaporation coating, ion beam coating and the like to prepare a film of non-transparent material over the plurality of pixel units, and then performs pattern lithography and etching on an hole to form the plurality of light transmission holes. Optionally, the plurality of pixel units and the light shielding layer are separated by a transparent medium layer.

In the embodiment of the present application, optionally, a direction of a connecting line of the center of the first light transmission hole 310 and the center of the first micro-lens 210 is similar to or the same as the direction of the first optical signal.

A direction of a connecting line of the center of the first light transmission hole 310 and the center of the first pixel unit 410 is similar to or the same as the direction of the first optical signal.

Optionally, wherein the center of the first micro-lens 210 is a center of the largest cross section thereof, for example, when the first micro-lens 210 has a spherical upper surface, and the lower surface of which is a quadrilateral micro-lens, the center of the quadrangle of the lower surface is the center of the first micro-lens 210.

Optionally, as shown in FIG. 4, the first optical signal is an optical signal having the same direction as the first refracted optical signal 202, a connecting line direction of the center of the first light transmission hole 310 and the center of the first micro-lens 210, as well as a connecting line direction of the center of the first light transmission hole 310 and the center of the first pixel unit 410 are similar or identical to the direction of the first refracted optical signal 202.

In this case, by respectively adjusting the relative positions among the first micro-lens 210, the first light transmission hole 310 and the first pixel unit 410, the first micro-lens 210 converges the first optical signal above to the first light transmission hole 310, the first optical signal is transmitted to the first pixel unit 410 through the first corresponding light transmission hole 310, and the second optical signal above the first micro-lens 210 is blocked by the optical shielding layer 300, such that the first pixel unit 410 can selectively receive an optical signal with the specific direction above the first micro-lens 210, thereby avoiding interference caused by receiving the second optical signal to the fingerprint imaging.

Optionally, each micro-lens in the micro-lens array 200 includes a corresponding light transmission hole and a pixel unit, and a relative positional relationship among each micro-lens and its corresponding light transmission hole and pixel unit is the same as the relative positional relationship among the first micro-lens 210 and its first corresponding light transmission hole 310 and the first pixel unit 410.

In the technical solution of the embodiment of the present application, the optical signal with the specific direction passing through the backlight module is converged to the plurality of light transmission holes through the micro-lens array 200, and the optical signal with the specific direction is transmitted to the optical detecting array 400 through the plurality of light transmission holes to perform optical fingerprint collection, and the optical signal with the non-specific direction is blocked by the light shielding layer 300, which can solve the influence of the LCD backlight module on the fingerprint optical imaging and improve the quality of fingerprint imaging.

Optionally, the under-screen fingerprint identification apparatus 20 includes two layers of light shielding layers. For example, as shown in FIG. 5, the under-screen fingerprint identification apparatus 20 includes the first light shielding layer 301 and the second light shielding layer 302, and the first light shielding layer 301 is disposed above the second light shielding layer 302.

Optionally, the micro-lens array 200 can be configured to converge an optical signal with the specific direction passing through the backlight module 120 to the plurality of light transmission holes on the first light shielding layer 301 or the second light shielding layer 302. The optical signal with the specific direction is transmitted to the photo detecting array 400 through the plurality of light transmission holes on the first light shielding layer 301 and the plurality of light transmission holes on the second light shielding layer 302. The micro-lens array 200 is also configured to converge an optical signal with the non-specific direction passing through the backlight module 120 to the light shielding region on the first light shielding layer 301 and the second light shielding layer 302, the optical signal with the non-specific direction cannot pass through the first light shielding layer 301 and the second light shielding layer 302 and cannot be received by the photo detecting array 400.

Optionally, the optical signal with the non-specific direction includes an optical signal of the main optical signal refracted through one of the first prism film side face and the second prism film side face; it further includes an optical signal of the non-main optical signal passing through the first prism film side face and/or the second prism film side face.

Figure 5:
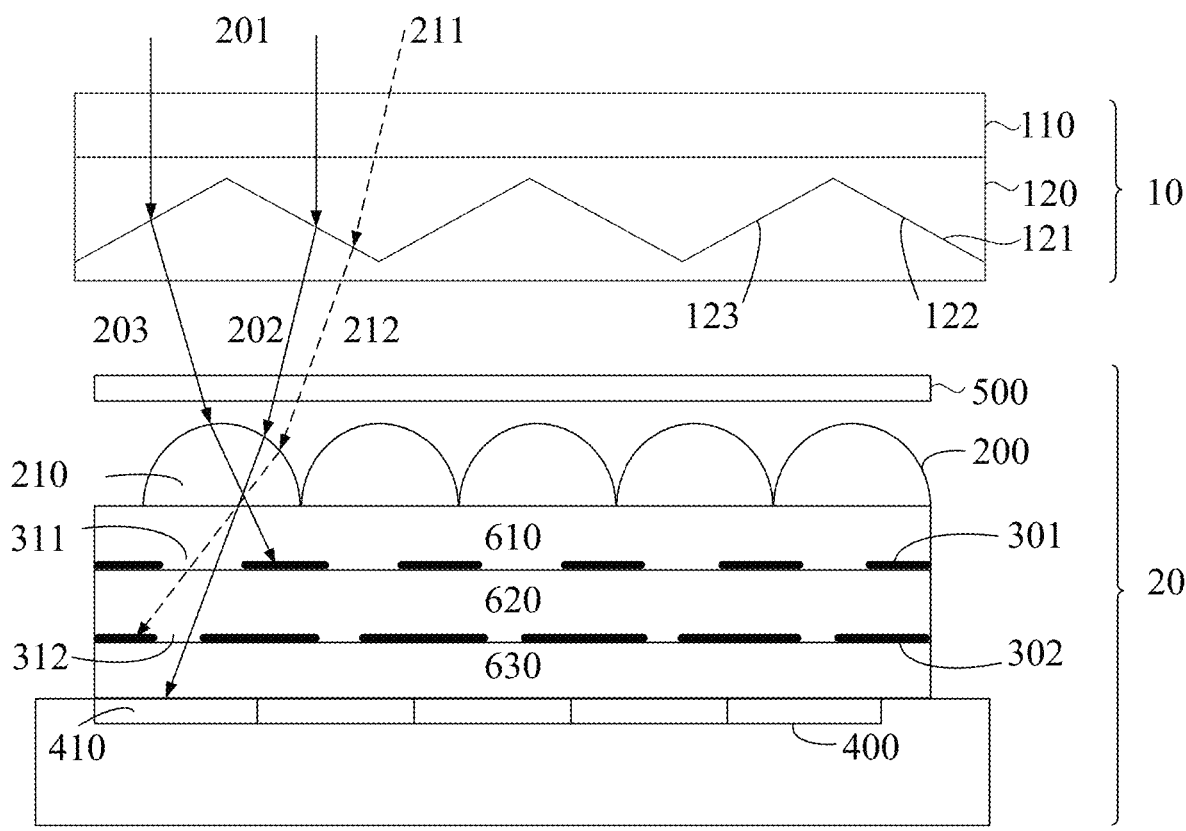
FIG. 5 is another schematic structural view of an under-screen fingerprint identification apparatus according to an embodiment of the present application.

For example, as shown in FIG. 5, the non-main optical signal 211 is an optical signal, of which an incident direction is not perpendicular to the backlight module 120, and the non-main optical signal 211 is refracted at the first prism film side face 122 to generate a third refracted optical signal 212. The optical signal with the specific direction is an optical signal having a same direction with the first refracted optical signal 202 of the main optical signal refracted by the first prism film side face 122, the optical signal with the non-specific direction includes an optical signal having a same direction with the second refracted optical signal 203 of the main optical signal 201 refracted by the second prism film side face 123, and an optical signal having a same direction with the third refracted optical signal 212 of the non-main optical signal 211 refracted by the first prism film side face 122.

Optionally, the optical signal with the non-specific direction may further include an optical signal having a same direction with a refracted optical signal of the non-main optical signal 211 refracted by the second prism film side face 123.

Optionally, the plurality of light transmission holes on the first light shielding layer 301 include a first corresponding light transmission hole 311, and the plurality of light transmission holes on the second light-shielding layer 302 include a second corresponding light transmission hole 312 corresponding to the first corresponding light transmission hole 311.

Optionally, in the embodiment of the present application, as shown in FIG. 5, the first light transmission hole 310 may include the first corresponding light transmission hole 311 and the second corresponding light transmission hole 312. The first corresponding light transmission hole 311 and the second corresponding light transmission hole 312 correspond to the first micro-lens 210.

Specifically, the first micro-lens 210 converges the first optical signal from the optical signal with the specific direction above the first micro-lens 210 to the first corresponding light transmission hole 311 or the second corresponding light transmission hole 312, and converges the second optical signal from the optical signal with the non-specific direction above the first micro-lens 210 to the light shielding region of the first light shielding layer 301 or the second light shielding layer 302. The first optical signal is transmitted to the first pixel unit 410 through the first corresponding light transmission hole 311 and the second corresponding light transmission hole 312.

For example, as shown in FIG. 5, the first optical signal is an optical signal above the first micro-lens 210, which has a same direction with the first refracted optical signal 202. The first micro-lens 210 converges the first refracted optical signal 202 to the first corresponding light transmission hole 311 or the second corresponding light hole 312, and the first refracted optical signal 202 is transmitted to the first pixel unit 410 through the first corresponding light transmission hole 311 and the second corresponding light hole 312. The second optical signal includes an optical signal above the first micro-lens 210, which has a same direction with the second refracted optical signal 203, and an optical signal having a same direction with the third refracted optical signal 212. The first micro-lens 210 converges the second refracted optical signal 203 to the first light shielding layer 301, and the second refracted optical signal 203 is blocked by the first light shielding layer 301 and cannot be received by the photo detecting array 400. The first micro-lens 210 converges the third refracted optical signal 212 to the second light shielding layer 302, and the third refracted optical signal 212 is blocked by the second light shielding layer 302 and cannot be received by the photo detecting array 400.

Optionally, a diameter of the light transmission hole on the first light-shielding layer 301 is larger than a diameter of the light transmission hole on the second light-shielding layer 302.

Optionally, the first corresponding light transmission hole 311 and the second corresponding light transmission hole 312 are circular holes having a diameter less than 10 μm which enables the optical imaging. Optionally, the diameters of the first corresponding light transmission hole 311 and the second corresponding light transmission hole 312 are greater than a certain threshold.

Optionally, a shape of the first corresponding light transmission hole 312 and the second corresponding light transmission hole 312 may also be a polygon, which is not limited in the embodiment of the present application.

Optionally, the first corresponding light transmission hole 311 and the second corresponding light transmission hole 312 are both circular hole, and the diameter of the first corresponding light transmission hole 311 is larger than that of the second corresponding light transmission hole 312.

Optionally, direction of a connecting line of a center of the light transmission hole of the first light-shielding layer 301 and a center of the corresponding light transmission hole of the second light-shielding layer 302 is similar to or the same as the direction of the optical signal with the specific direction.

Optionally, direction of a connecting line of a center of the first corresponding light transmission hole 311 and a center of the second corresponding light transmission hole 312 is similar to or the same as the direction of the first optical signal.

For example, as shown in FIG. 5, direction of a connecting line of the center of the first corresponding light transmission hole 311 and the center of the second corresponding light transmission hole 312 is similar to the direction of the first refracted optical signal 202.

In the embodiment of the present application, by respectively adjusting the relative positions among the first micro-lens 210, the first corresponding light transmission hole 311, the second corresponding light transmission hole 312 and the first pixel unit 410, such that the first optical signal with the specific direction can be transmitted to the first pixel unit 410, and the optical signal with the non-specific direction is blocked from being transmitted to the first pixel unit 410, thereby further reducing the interference of the optical signal with the non-specific direction on the fingerprint image identification, and improving the quality of fingerprint imaging.

Optionally, a shape and size of each of the light transmission holes on the first light shielding layer 301 is the same as a shape and size of the first corresponding light transmission holes 311, and a shape and size of each of the light transmission holes on the second light shielding layers 302 is the same as a shape and size of the second corresponding light transmission hole 312.

Optionally, a relative positional relationship between each of the light transmission holes on the first light shielding layer 301 and its corresponding light transmission holes on the second light shielding layer 302 is the same as a relative positional relationship between the first corresponding light transmission hole 311 and the second corresponding light transmission hole 312.

It should be understood that a shape of the first corresponding light transmission hole may be the same as or different from that of the second corresponding light transmission hole 312, which is not limited by the embodiment of the present application.

It should be understood that although the above description is made by taking two layers of light shielding layer as an example, the technical solution of the embodiment of the present application is not limited to two layers of light shielding layer. For the case of more than two layers of light shielding layer, the design of the two layers of light shielding layer described above may be employed between every two layers of light shielding layer.

Optionally, the under-screen fingerprint identification apparatus 20 further includes:

a filter layer 500, which is configured to filter out an optical signal having a non-target band and transmit the optical signal having a target band (i.e., an optical signal having a desired band for fingerprint image collection).

Optionally, the filter layer 500 is disposed in an optical path between the backlight module 120 and the photo detecting array 400.

Optionally, a lower surface of the filter layer 500 is completely adhered to an upper surface of the micro-lens array 200 through an adhesive layer, and there is no air layer between the filter layer 500 and the micro-lens array 200. Optionally, the adhesive layer may be a low refractive index adhesive having a refractive index less than 1.25.

Optionally, as shown in FIG. 5, the filter layer 500 may also be fixed above the micro-lens array 200 by a low refractive index adhesive or other fixing device, there is a certain air gap between the lower surface of the filter layer 500 and the upper surface of the first micro-lens array 200.

In the embodiment of the present application, the filter layer 500 may be a visible light filter, and may specifically be used to filter out a wavelength of visible light, for example, a visible light for image display. The filter may specifically include one or more optical filters, which may be configured, for example, as a belt pass filter to filter out light emitted by a visible light source while not filtering out an infrared optical signal. The one or more optical filters can be implemented, for example, as an optical filter coating formed on one or more continuous interfaces, or can be implemented on one or more discrete interfaces.

It should be understood that the filter layer 500 can be fabricated on a surface of any optical component or along an optical path of a reflected light formed by finger reflection to the photo detecting array 300. FIG. 5 is only an example in which the filter layer 500 is disposed between the backlight module 120 and the micro-lens array 200, but the application is not limited thereto. For example, the filter layer 500 can also be disposed in the backlight module 120.

Optionally, the under-screen fingerprint identification apparatus 20 further includes: a transparent medium layer, which is configured to transmit the optical signal and is disposed in at least one of the following regions:

between the first micro-lens array and the at least one light shielding layer, in the light transmission hole, between the at least one light shielding layer or between the at least one light shielding layer and the photo detecting array.

Optionally, as shown in FIG. 5, the transparent medium layer 600 includes a first transparent medium layer 610, a second transparent medium layer 620, and a third transparent medium layer 630. The first transparent medium layer 610 is disposed between the micro-lens array 200 and the first light shielding layer 301, as well as inside the plurality of light transmission holes on the first light shielding layer 301; the second transparent medium layer 620 is disposed between the first light shielding layer 301 and the second light shielding layer 302, as well as inside the plurality of light transmission holes in the second light shielding layer 302; the third transparent medium layer 630 is disposed between the second light shielding layer 302 and the photo detecting array 400.

Optionally, the micro-lens array 200 and the first light shielding layer 301 are connected by the first transparent medium layer 610, the first light shielding layer 301 and the second light shielding layer 302 are connected by the second transparent medium layer 620, the second light shielding layer 302 and the photo detecting array 400 are connected by the third transparent medium layer 630.

Optionally, the first transparent medium layer 610, the second transparent medium layer 620, and the third transparent medium layer 630 are organic transparent medium materials or inorganic transparent medium materials such as resin or silicon oxide.

Optionally, the first transparent medium layer 610, the second transparent medium layer 620, and the third transparent medium layer 630 have a same or different transparent medium material.

Optionally, the photo detecting array 400 is a photoelectric sensor die, and the transparent medium layer 600 is a resin coated on the light detecting die.

Optionally, the transparent medium layer 600 is a silicon oxide disposed above the plurality of pixel units in the photo detecting array 400, and is packaged in the photoelectric sensor die together with the photo detecting array 400, specifically, by adopting evaporation process, the transparent medium layer 600 can be generated through coating film on the plurality of pixel units of the photoelectrical sensor, for example, by atomic layer deposition, sputter coating, electron beam evaporation coating, ion beam coating, etc., a silicon oxide transparent medium layer is prepared over the plurality of pixel units of the photoelectrical sensor.

Specifically, the light shielding layer 300 and the transparent medium layer 600 are both packaged in the photoelectrical sensor with the photo detecting array 400, and firstly, the transparent medium layer 600 is formed on the plurality of pixel units in the photoelectrical sensor, and then the light shielding layer 300 is prepared over the transparent medium layer.

Optionally, one or more layers of the transparent medium layer 600 are packaged together with the photo detecting array 400.

Optionally, the transparent medium layer packaged in the photoelectrical sensor chip together with the photo detecting array 400 is an inorganic material.

It should be understood that although the above description is made by taking a transparent medium layer in the case of having two layers of light shielding layer as an example, the technical solution of the embodiment of the present application is not limited to two layers of light shielding layer. For the case of more than two layers of light shielding layer, the design of the transparent medium layer in the case of having two layers of light shielding layer described above may be employed between every two layers of light shielding layer.

Optionally, the under-screen fingerprint identification apparatus 20 includes three layers of light shielding layer. For example, as shown in FIG. 6, the under-screen fingerprint identification apparatus 20 further includes a third light shielding layer 303, and the third light shielding layer 303 is disposed above the first light shielding layer 301.

Figure 6:
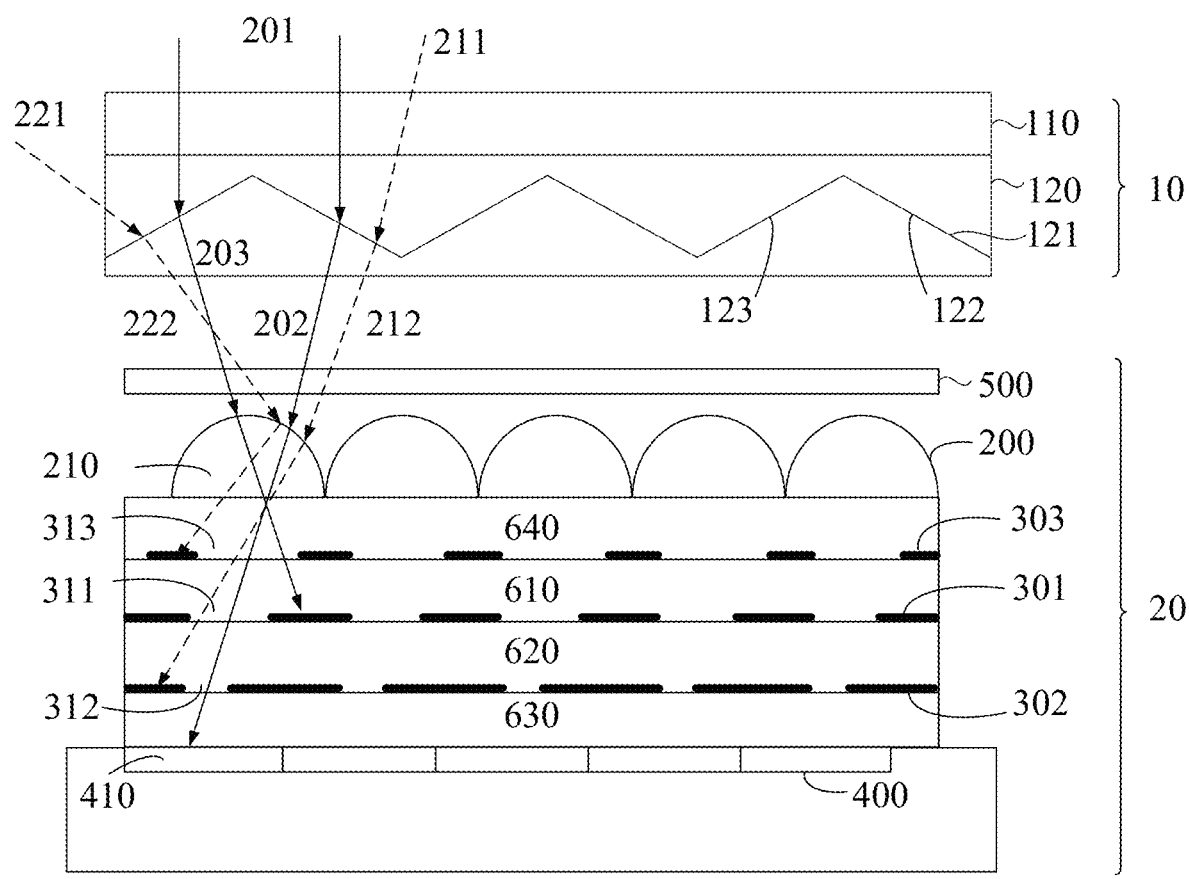
FIG. 6 is another schematic structural view of an under-screen fingerprint identification apparatus according to an embodiment of the present application.

For example, as shown in FIG. 6, the non-main optical signal 221 is an optical signal, of which the incident direction is not perpendicular to the backlight module 120, and the non-main optical signal 221 is refracted on the second prism film side face 123 to generate a fourth refracted optical signal 222. The optical signal with the non-specific direction further includes an optical signal having a same direction with the fourth refracted optical signal 222 of the non-main optical signal 221 refracted by the second prism film side face 123.

Optionally, a plurality of light transmission holes on the third light shielding layer 303 include a third corresponding light transmission hole 313.

Optionally, in the embodiment of the present application, as shown in FIG. 6, the first light transmission hole 310 may include the first corresponding light transmission hole 311, the second corresponding light transmission hole 312 and the third corresponding light transmission hole 313. The third corresponding light transmission hole also corresponds to the first micro-lens 210.

Specifically, the first micro-lens 210 converges the first optical signal from the optical signal with the specific direction above the first micro-lens 210 to the first corresponding light transmission hole 311, the second corresponding light transmission hole 312 or the third corresponding light transmission hole 313, and converges the second optical signal from the optical signal with the non-specific direction above the first micro-lens 210 to the light shielding region of the first light shielding layer 301, the second light shielding layer 302 or the third light shielding layer 303. The first optical signal is transmitted to the first pixel unit 410 through the first corresponding light transmission hole 311, the second corresponding light transmission hole 312 and the third corresponding light transmission hole 313.

For example, as shown in FIG. 6, the second optical signal further includes an optical signal having a same direction with the fourth refracted optical signal 222. The first micro-lens 210 converges the fourth refracted optical signal 222 to the third light shielding layer 303, and the fourth refracted optical signal 222 is blocked by the third light shielding layer 303 and cannot be received by the photo detecting array 400.

Optionally, a diameter of the light transmission hole on the third light-shielding layer 303 is larger than a diameter of the light transmission hole on the first light shielding layer 301 and the second light-shielding layer 302.

Optionally, the third corresponding light transmission hole 313 is a circular hole having a diameter less than 10 μm and greater than a certain threshold.

Optionally, a shape of the third corresponding light transmission hole 313 may also be a polygon, which is not limited in the embodiment of the present application.

Optionally, direction of a connecting line of centers of the light transmission hole of the first light-shielding layer 301, the second light-shielding layer 302 and the third light-shielding layer 303 is similar to or the same as the direction of the optical signal with the specific direction.

Optionally, direction of a connecting line of centers of the first corresponding light transmission hole 311, the second corresponding light transmission hole 312 and the third corresponding light transmission hole 313 is similar to or the same as the direction of the first optical signal.

In the embodiment of the present application, by respectively adjusting the relative positions among the first micro-lens 210, the first corresponding light transmission hole 311, the second corresponding light transmission hole 312, the third corresponding light transmission hole 313 and the first pixel unit 410, thereby further reducing the interference of the optical signal with the non-specific direction on the fingerprint image identification, and improving the quality of fingerprint imaging.

Optionally, as shown in FIG. 6, the under-screen fingerprint identification apparatus 20 further correspondingly includes: a fourth transparent medium layer 640, disposed between the first micro-lens array 200 and the third light shielding layer 303, as well as inside the plurality of light transmission holes in the third light shielding layer 303.

Optionally, as shown in FIG. 6, the micro-lens array 200 and the third light shielding layer 301 are connected by the fourth transparent medium layer 640, the third light shielding layer 303 and the first light shielding layer 301 are connected by the first transparent medium layer 610, the first light shielding layer 301 and the second light shielding layer 302 are connected by the second transparent medium layer 620, the second light shielding layer 302 and the photo detecting array 400 are connected by the third transparent medium layer 630.

Optionally, the fourth transparent medium layer 640 is an organic transparent medium material or inorganic transparent medium material such as resin or silicon oxide.

Optionally, the fourth transparent medium layer 640 has a same or different transparent medium material with the first transparent medium layer 610, the second transparent medium layer 620 and the third transparent medium layer 630.

Optionally, the under-screen fingerprint identification apparatus 20 further includes: an infrared light source, configured to provide an infrared excitation light for fingerprint detection of the under-screen fingerprint identification apparatus, the infrared excitation light is irradiated to at least part of the display area of the liquid crystal display, the at least part of the display area at least partially covers a fingerprint detecting area of the under-screen fingerprint identification apparatus;

wherein the optical signal with the specific direction includes an infrared optical signal with the specific direction of the infrared excitation light of the infrared light source passing through the backlight module after being reflected by the finger, the optical signal with the non-specific direction includes an infrared optical signal with the non-specific direction of the infrared light of the infrared light source passing through the backlight module after being reflected by the finger.

In a possible implementation, the optical signal with the specific direction may be an infrared optical signal with the specific direction of the infrared excitation light of the light source passing through the backlight module after being reflected by a finger, the optical signal with the non-specific direction may be an infrared optical signal with the non-specific direction of the infrared excitation light of the light source passing through the backlight module after being reflected by a finger.

Optionally, the infrared excitation light is the main optical signal of the infrared light source, that is, the infrared excitation light is an optical signal with a main light emitting direction of the infrared light source. For example, the main light emitting direction of the infrared light source is a direction of a connecting line between a center of the light source and a center of a target of the light source, and the infrared excitation light is an optical signal having a same direction with a direction of a connecting line between a center of the light source and a center of a target.

Figure 7:
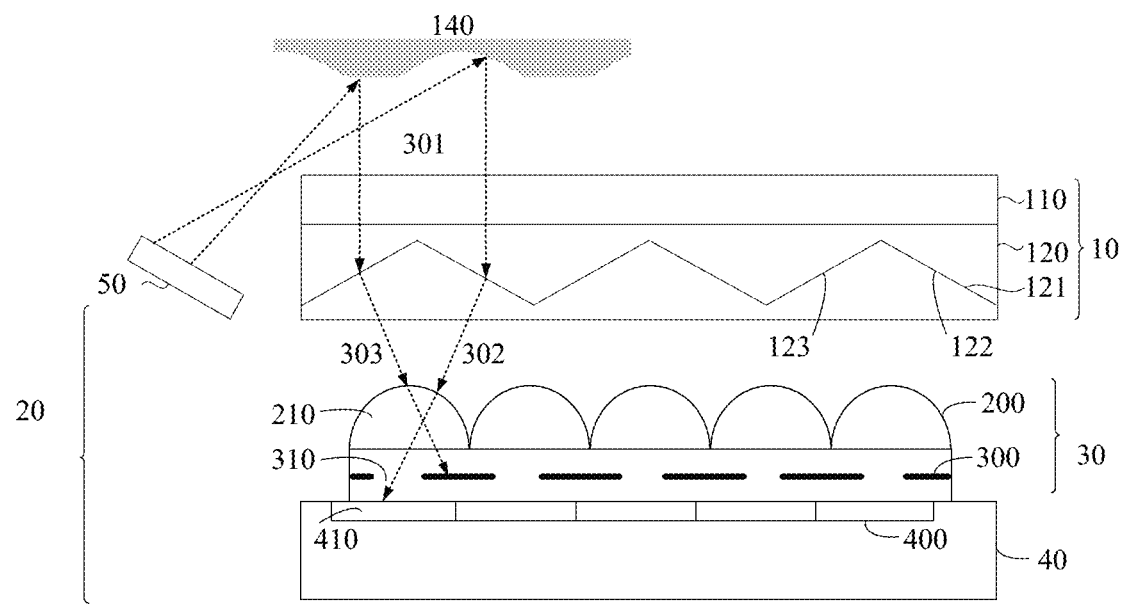
FIG. 7 is another schematic structural view of an under-screen fingerprint identification apparatus according to an embodiment of the present application.

Specifically, as shown in FIG. 7, the under-screen fingerprint identification apparatus 20 further includes an infrared light source 50 for emitting infrared excitation light, the optical signal with the specific direction includes an infrared optical signal with the specific direction of the infrared excitation light of the infrared light source 50 passing through the backlight module 120 after being reflected by the finger. Optionally, the infrared optical signal with the specific direction may be an infrared optical signal refracted through one of the first prism film side face and the second prism film side face of the prism film 121 in the backlight module 120.

Optionally, the infrared optical signal with the specific direction may be an optical signal of the main infrared optical signal refracted through one of the first prism film side face and the second prism film side face of the prism film in the backlight module; wherein the main infrared optical signal is an infrared optical signal of the infrared excitation light of the infrared light source reflected by the finger, and an incident direction of the main infrared optical signal is perpendicular to the backlight module. The infrared optical signal with the non-specific direction includes an optical signal of the main infrared optical signal refracted through another of the first prism film side face and the second prism film side face.

For example, as shown in FIG. 7, the main infrared optical signal 301 is a beam of optical signal that reflected by the finger 140, of which an incident direction is perpendicular to the backlight module 120, and the main infrared optical signal 301 is refracted at the first prism film side face 122 to generate a first refracted infrared optical signal 302, and the main infrared optical signal 301 is refracted at the second prism film side face 123 to generate a second refracted infrared optical signal 303, the infrared optical signal with the specific direction is an optical signal having a same direction with the first refracted infrared optical signal 302, the infrared optical signal with the non-specific direction includes an optical signal that is in the same direction as the second refracted infrared optical signal 303.

As a possible implementation, as shown in FIG. 7, the optical signal with the specific direction includes the first refracted infrared optical signal 302, the first refracting infrared optical signal 302 can be received by the photo detecting array 400 through the light transmission hole on the light shielding layer 300. The optical signal with the non-specific direction includes the second refracted infrared optical signal 303, the second refracted infrared optical signal 303 is blocked by the light shielding region on the light shielding layer 300 and cannot be received by the photo detecting array 400.

Optionally, the infrared light source 50 may be disposed under a glass cover of an electronic device and disposed side by side with a liquid crystal panel of the liquid crystal display screen.

Optionally, the infrared light source 50 may be obliquely attached to the glass cover. For example, the infrared light source 50 may be obliquely attached to a display screen 10 with an optical adhesive. Optionally, the optical adhesive may be any optical liquid adhesive or optical solid adhesive.

Optionally, an infrared light transmitting layer may be disposed between the infrared light source 50 and the glass cover and/or between the infrared light source 50 and the liquid crystal display screen 10, and the infrared light transmitting layer is configured to transmit the infrared excitation light and block the visible light.

Optionally, the infrared light source 50 is disposed in a non-display area at an edge of the electronic device.

Optionally, the infrared light source 50 may be a single or multiple light-emitting diodes (LEDs). Optionally, a plurality of the infrared light emitting diodes may be formed into a strip-shaped infrared light source distributed around the under-screen fingerprint identification apparatus 20.

In the embodiment of the present application, optical fingerprint detection by adopting an infrared light with the specific direction of the infrared light source can reduce the interference of the visible light of the screen on the infrared light fingerprint detection, and further improve the quality of fingerprint imaging.

Figure 8:
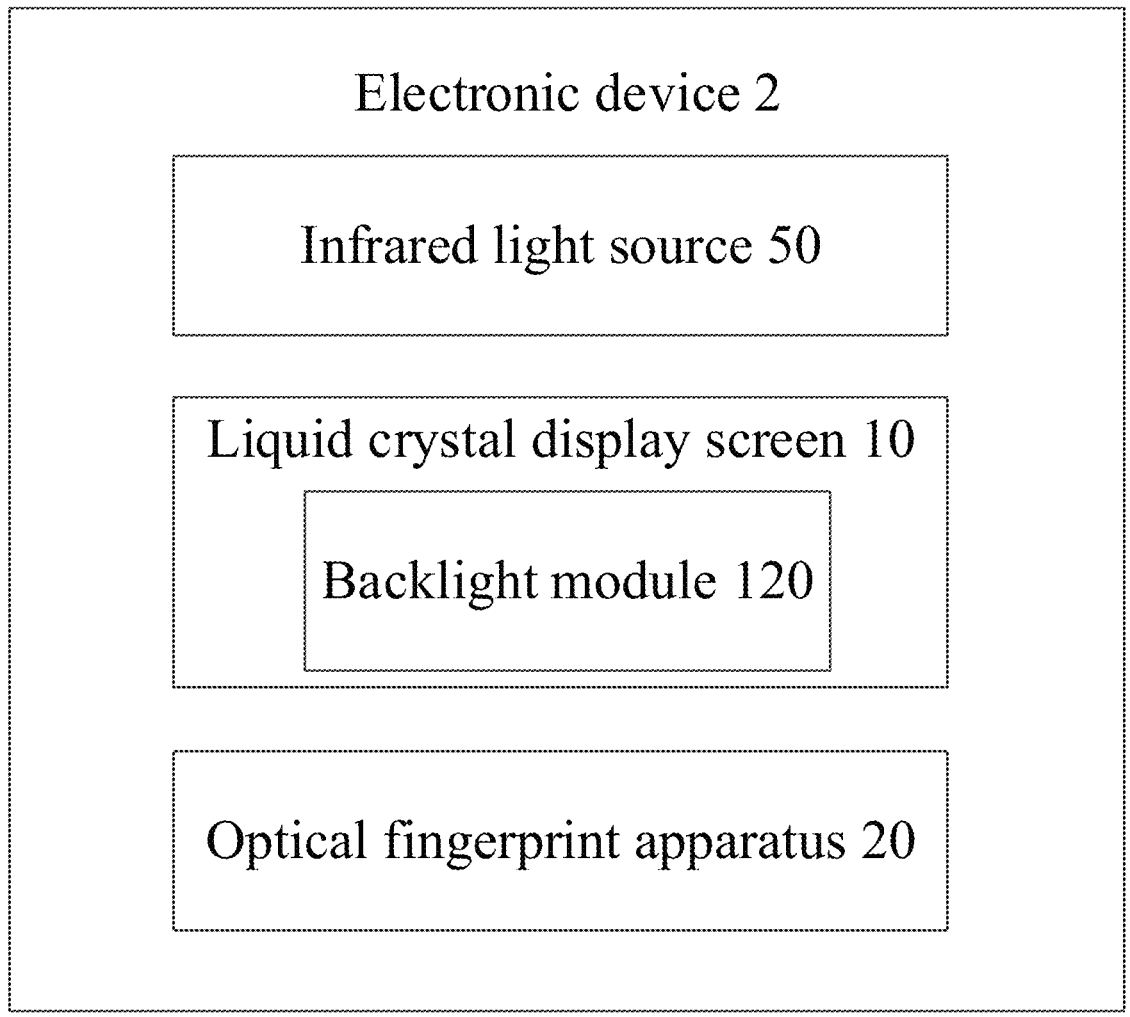
FIG. 8 is a schematic block diagram of an electronic device according to an embodiment of the present application.

As shown in FIG. 8, the embodiment of the present application further provides an electronic device 2, which may include the liquid crystal display screen 10 and the under-screen fingerprint identification apparatus 20 described in the above embodiment of the present application, wherein the liquid crystal display screen 10 includes the backlight module 120, and the under-screen fingerprint identification apparatus 20 is disposed under the backlight module 120.

The electronic device 2 can be any electronic device having a liquid crystal display screen and a backlight module.

Optionally, as shown in FIG. 8, in the case that the under-screen fingerprint identification apparatus 20 does not include an infrared light source, the electronic device 2 may further include the infrared light source 50.

Optionally, the infrared light source 50 may be disposed under the glass cover of the electronic device and disposed side by side with the liquid crystal panel of the liquid crystal display screen.

Figure 9:
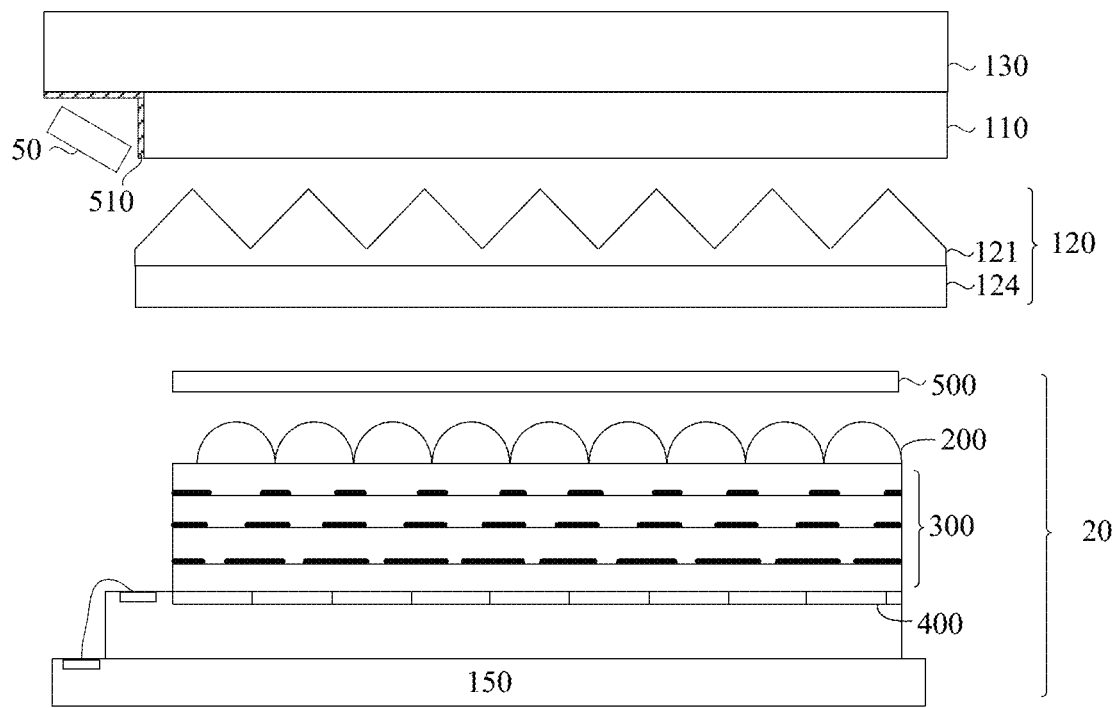
FIG. 9 is a schematic structural view of an electronic device provided by an embodiment of the present application.

For example, in a possible embodiment, as shown in FIG. 9, the infrared light source 50 is disposed under the glass cover 130 of the electronic device 2 and is disposed side by side with the liquid crystal panel 110 of the liquid crystal display screen 10, and is disposed obliquely above the backlight module 120 of the liquid crystal display screen 10. Specifically, the backlight module 120 includes a prism film 121 and other structures 124 of the backlight module.

Figure 10:
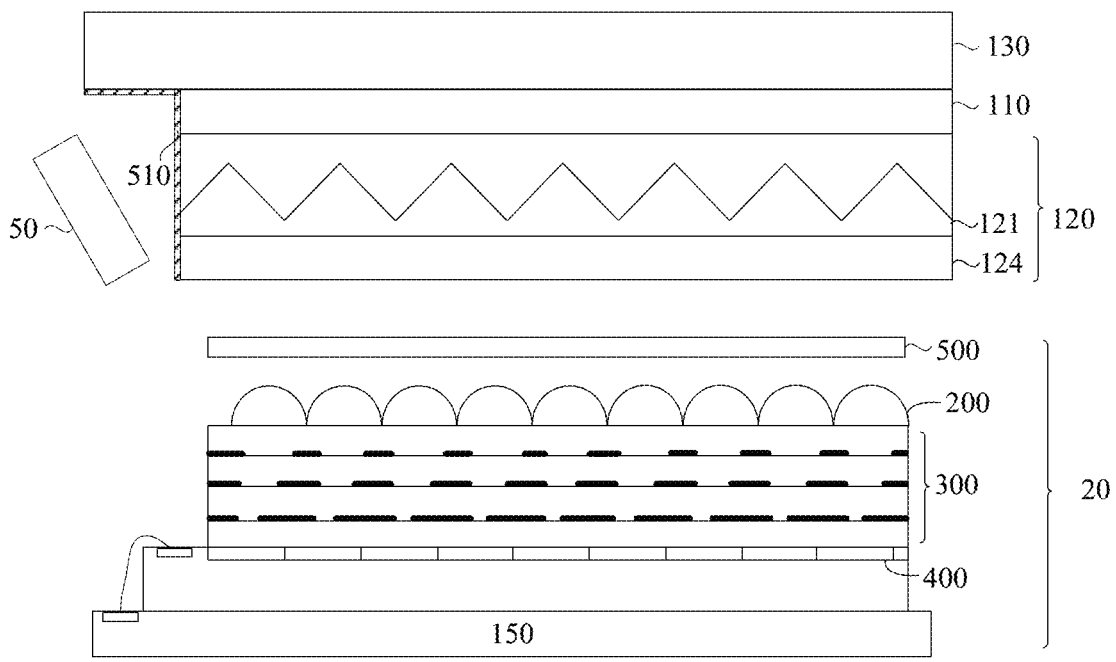
FIG. 10 is a schematic structural view of another electronic device provided by an embodiment of the present application.

For example, in another possible embodiment, as shown in FIG. 10, the infrared light source 50 is disposed under the glass cover 130 of the electronic device 2 and is disposed side by side with the liquid crystal panel 110 in the liquid crystal display screen 10 as well as the backlight module 120.

Optionally, as shown in FIG. 9 and FIG. 10, the infrared light source 50 may be obliquely attached under the glass cover. For example, the infrared light source 50 may be obliquely attached under the display screen 10 with an optical adhesive. Optionally, the optical adhesive may be any optical liquid adhesive or optical solid adhesive.

Optionally, as shown in FIG. 9 and FIG. 10, the infrared light transmitting layer 510 may be disposed between the infrared light source 50 and the glass cover and/or between the infrared light source 50 and the liquid crystal display screen 10, and the infrared light transmitting layer 510 is configured to transmit the infrared excitation light and block the visible light.

Optionally, the infrared light transmitting layer 510 may be an infrared-transmitted ink.

Optionally, the infrared light source 50 is disposed in the non-display area at an edge of the electronic device 2. For example, the electronic device 2 is a mobile phone, and the non-display area is a frame area of the mobile phone surface on which an image is not displayed, specifically, the infrared light source 50 is disposed in a lower area corresponding to the frame area of the mobile phone surface on which an image is not displayed.

It should be understood that the specific examples in the embodiments of the present application are only intended to help those skilled in the art to better understand the embodiments of the present application, and are not intended to limit the scope of the embodiments of the present application.

It should also be noted that, terms used in embodiment of the present application and the claims appended hereto are merely for the purpose of describing particular embodiments, and are not intended to limit the embodiments of the present application. For example, the use of a singular form of "a", "the" and "said" in the embodiment of the present application and the claims appended hereto are also intended to include a plural form, unless otherwise clearly indicated herein by context.

Those of ordinary skill in the art may be aware that, various exemplary units described in combination with the embodiments disclosed herein may be implemented by electronic hardware, computer software or a combination of both, to clearly illustrate the interchangeability of hardware and software, the components and steps of the various embodiments have been generally described in terms of functionality in the foregoing description. Whether these functions are executed in hardware or software mode depends on a particular application and a design constraint condition of the technical solution. Persons skilled in the art may use different methods to implement the described functions for every particular application, but it should not be considered that such implementation goes beyond the scope of the present application.

In the several embodiments provided by the present application, it should be understood that the disclosed system and apparatus may be implemented in other manners. For example, the apparatus described in the foregoing embodiments are merely illustrative. For example, the division of the unit is only a division of logical function. In actual implementation, there may be another division manner, for example, multiple units or components may be combined or may be integrated into another system, or some features can be ignored or not executed. In addition, the mutual coupling or direct coupling or communication connection shown or discussed may be an indirect coupling or communication connection through certain interface, device or unit, or an electrical, mechanical or other form of connection.

The units described as separate components may or may not be physically separated, and the components used as display units may or may not be physical units, that is, may be located in one place, or may be distributed to multiple network units. Depending on the actual needs, part or all of the units may be selected to achieve the purpose of the embodiments of the present application.

In addition, each functional unit in each embodiment of the present application may be integrated into one processing unit, or each unit may be physical existence separately, or two or more units may be integrated into one unit. The foregoing integrated unit may be implemented in the form of hardware or in the form of a software functional unit.

If the integrated unit is implemented in the form of a software functional unit and sold or used as a standalone product, it may be stored in a readable storage medium of a computer. Based on such understanding, the technical solution of the present application in essence or the part making contribution to the prior art, or all or part of the technical solution may be embodied in the form of a software product, the computer software product is stored in a storage medium and includes a number of instructions for instructing a computer device (may be a personal computer, server, or network device, etc.) to perform all or part of the steps of the methods described in various embodiments of the present application. The foregoing storage medium includes: U disk, mobile hard disk, read-only memory (ROM), random access memory (RAM), a magnetic disk, or an optical disk, and the like that may store program code.

The foregoing contents are merely a specific implementation of the embodiments of the present application, but the protection scope of the present application is not limited thereto. Various modifications or replacements may be readily conceivable to any person skilled in the art within the technical scope disclosed in the present application, and such modifications or replacements shall fall within the protection scope of the present application. Therefore, the protection scope of the embodiments the present application shall be defined by the claims.

What is claimed is:

1. An under-screen fingerprint identification apparatus, applicable for an electronic device with a liquid crystal display screen, comprising:
   a micro-lens array, disposed under a backlight module of the liquid crystal display screen;
   at least one light shielding layer, disposed under the micro-lens array, wherein the light shielding layer is provided with a plurality of light transmission holes, the at least one light shielding layer comprises a first light shielding layer and a second light shielding layer, the first light shielding layer is located above the second light shielding layer; and
   a photo detecting array, disposed under the light shielding layer,
   wherein the backlight module is configured to refract a vertical optical signal reflected by a finger and transmit the refracted optical signal to the micro-lens array, the micro-lens array is configured to converge an optical signal with a specific direction passing through the backlight module to the plurality of light transmission holes of the first light shielding layer and the second light shielding layer, and transmit an optical signal with a non-specific direction passing through the backlight module to a light shielding region of the first light shielding layer or a light shielding region of the second light shielding layer, and the optical signal with the specific direction is transmitted to the photo detecting array through the plurality of light transmission holes, the optical signal with the specific direction is an optical signal refracted through one of a first prism film side face and a second prism film side face of a prism film in the backlight module, the optical signal with the non-specific direction includes an optical signal refracted through another of the first prism film side face and the second prism film side face;
   wherein the micro-lens array comprises a plurality of micro-lenses, and the photo detecting array comprises a plurality of pixel units, the first light shielding layer is provided with a first corresponding light transmission hole, and the second light shielding layer is provided with a second corresponding light transmission hole;
   wherein a first micro-lens of the plurality of micro-lenses is configured to converge a first optical signal above the first micro-lens in the optical signal refracted through one of the first prism film side face and the second prism film side face of the prism film in the backlight module into the first corresponding light transmission hole and the second corresponding light transmission hole corresponding to the first micro-lens, and transmit a second optical signal above the first micro-lens in the optical signal refracted through another of the first prism film side face and the second prism film side face into the light shielding region of the first light shielding layer or the light shielding region of the second light shielding layer, the first optical signal is transmitted through the first corresponding light transmission hole and the second corresponding light transmission hole to a first pixel unit of the plurality of pixel units corresponding to the first micro-lens.

2. The under-screen fingerprint identification apparatus according to claim 1, wherein the optical signal with the specific direction is an optical signal of a main optical signal refracted through one of a first prism film side face and a second prism film side face of a prism films in the backlight module;
   the optical signal with the non-specific direction includes an optical signal of the main optical signal refracted through another of the first prism film side face and the second prism film side face;
   wherein the main optical signal is an optical signal of a main optical signal of a light source reflected by a finger, the main optical signal of the light source is an optical signal having a same direction with a direction of a connecting line between a center of the light source and a center of the finger.

3. The under-screen fingerprint identification apparatus according to claim 2, wherein the optical signal with the non-specific direction further includes an optical signal of a non-main optical signal passing through the first prism film side face and/or the second prism film side face;
   wherein the non-main optical signal is an optical signal of a non-main optical signal of the light source reflected by the finger.

4. The under-screen fingerprint identification apparatus according to claim 1, wherein a direction of a connecting line of a center of a first light transmission hole and a center of the first micro-lens is similar to or same as a direction of the optical signal with the specific direction;
   a direction of a connecting line of the center of the first light transmission hole and a center of the first pixel unit is similar to or same as the direction of the optical signal with the specific direction, wherein the first light transmission hole comprises the first corresponding light transmission hole and the second corresponding light transmission hole.

5. The under-screen fingerprint identification apparatus according to claim 1, wherein the under-screen fingerprint identification apparatus further includes:
   a filter layer, which is disposed in an optical path between the backlight module and the photo detecting array, and is configured to filter out an optical signal having a non-target band and transmit an optical signal having a target band.

6. The under-screen fingerprint identification apparatus according to claim 1, wherein the under-screen fingerprint identification apparatus further includes:
   an infrared light source, configured to provide an infrared excitation light for fingerprint detection of the under-screen fingerprint identification apparatus, wherein the infrared excitation light is irradiated to at least part of the display area of the liquid crystal display screen, and the at least part of the display area at least partially covers a fingerprint detecting area of the under-screen fingerprint identification apparatus;
   wherein the optical signal with the specific direction includes an infrared optical signal with the specific direction of the infrared excitation light of the infrared light source passing through the backlight module after being reflected by the finger.

7. The under-screen fingerprint identification apparatus according to claim 6, wherein the infrared excitation light is a main optical signal of the infrared light source, the main optical signal of the infrared light source is an optical signal with a main light emitting direction of the infrared light source, and the main light emitting direction of the infrared light source is a direction of a connecting line between a center of the light source and a center of a target of the light source.

8. The under-screen fingerprint identification apparatus according to claim 6, wherein the infrared light source is disposed under a glass cover of the electronic device and disposed side by side with a liquid crystal panel of the liquid crystal display screen.

9. The under-screen fingerprint identification apparatus according to claim 8, wherein the infrared light source is obliquely attached under the glass cover.

10. The under-screen fingerprint identification apparatus according to claim 8, wherein the under-screen fingerprint identification apparatus further includes: an infrared light transmission layer, which is disposed between the infrared light source and the glass cover and/or between the infrared light source and the liquid crystal display screen, and is configured to transmit the infrared excitation light and block a visible light.

11. The under-screen fingerprint identification apparatus according to claim 6, wherein the infrared light source is disposed in a non-display area at an edge of the electronic device.

12. The under-screen fingerprint identification apparatus according to claim 1, wherein a diameter of a light transmission hole of the first light shielding layer is larger than a diameter of a light transmission hole of the second light shielding layer;
   wherein a direction of a connecting line of a center of a light transmission hole of the first light shielding layer and a center of a corresponding light transmission hole of the second light shielding layer is similar to a direction of the optical signal with the specific direction.

13. The under-screen fingerprint identification apparatus according to claim 1, wherein the at least one light shielding layer further comprises a third light shielding layer, the third light shielding layer is located above the first light shielding layer, and the third light shielding layer is provided with a third corresponding light transmission hole corresponding to the first micro-lens;
   wherein a first micro-lens of the plurality of micro-lenses is configured to converge a first optical signal above the first micro-lens in the optical signal with the specific direction into the first corresponding light transmission hole, the second corresponding light transmission hole and the third corresponding light transmission hole, and transmit a second optical signal above the first micro-lens in the optical signal with the non-specific direction into a light shielding region of the light shielding layer, the first optical signal is transmitted through the first corresponding light transmission hole, the second corresponding light transmission hole and the third corresponding light transmission hole to a first pixel unit of the plurality of pixel units corresponding to the first micro-lens.

14. An electronic device, comprising a liquid crystal display screen and an under-screen fingerprint identification apparatus, wherein the liquid crystal display screen includes a backlight module, and the under-screen fingerprint identification apparatus is disposed under the backlight module, the under-screen fingerprint identification apparatus comprising:
   a micro-lens array, configured to be disposed under a backlight module of the liquid crystal display screen;
   at least one light shielding layer, disposed under the micro-lens array, wherein the light shielding layer is provided with a plurality of light transmission holes, the at least one light shielding layer comprises a first light shielding layer and a second light shielding layer, the first light shielding layer is located above the second light shielding layer; and
   a photo detecting array, disposed under the light shielding layer,
   wherein the backlight module is configured to refract a vertical optical signal reflected by a finger and transmit the refracted optical signal to the micro-lens array, the micro-lens array is configured to converge an optical signal with a specific direction passing through the backlight module to the plurality of light transmission holes of the first light shielding layer and the second light shielding layer, and transmit an optical signal with a non-specific direction passing through the backlight module to a light shielding region of the first light shielding layer or a light shielding region of the second light shielding layer, and the optical signal with the specific direction is transmitted to the photo detecting array through the plurality of light transmission holes, the optical signal with the specific direction is an optical signal refracted through one of a first prism film side face and a second prism film side face of a prism film in the backlight module, the optical signal with the non-specific direction includes an optical signal refracted through another of the first prism film side face and the second prism film side face;
   wherein the micro-lens array comprises a plurality of micro-lenses, and the photo detecting array comprises a plurality of pixel units, the first light shielding layer is provided with a first corresponding light transmission hole, and the second light shielding layer is provided with a second corresponding light transmission hole;
   wherein a first micro-lens of the plurality of micro-lenses is configured to converge a first optical signal above the first micro-lens in the optical signal refracted through one of the first prism film side face and the second prism film side face of the prism film in the backlight module into the first corresponding light transmission hole and the second corresponding light transmission hole corresponding to the first micro-lens, and transmit a second optical signal above the first micro-lens in the optical signal refracted through another of the first prism film side face and the second prism film side face into the light shielding region of the first light shielding layer or the light shielding region of the second light shielding layer, the first optical signal is transmitted through the first corresponding light transmission hole and second corresponding light transmission hole to a first pixel unit of the plurality of pixel units corresponding to the first micro-lens.

15. The electronic device according to claim 14, further comprising:
   an infrared light source, configured to provide an infrared excitation light for fingerprint detection of the under-screen fingerprint identification apparatus, wherein the infrared excitation light is irradiated to at least part of the display area of the liquid crystal display screen, and the at least part of the display area at least partially covers the fingerprint detecting area of the under-screen fingerprint identification apparatus;
   wherein the optical signal with the specific direction includes an infrared optical signal with the specific direction of the infrared excitation light of the infrared light source passing through the backlight module after being reflected by the finger.

16. The electronic device according to claim 15, wherein the infrared excitation light is a main optical signal of the infrared light source.

17. The electronic device according to claim 15, wherein the infrared light source is disposed under a glass cover of the electronic device and disposed side by side with the liquid crystal panel of the liquid crystal display screen.

18. The electronic device according to claim 17, wherein the infrared light source is obliquely attached under the glass cover.

19. The electronic device according to claim 17, wherein the electronic device further includes: an infrared light transmission layer, which is disposed between the infrared light source and the glass cover and/or between the infrared light source and the liquid crystal display screen, and is configured to transmit the infrared excitation light and block the visible light.

20. The electronic device according to claim 15, wherein the infrared light source is disposed in a non-display area at an edge of the electronic device.

\* \* \* \* \*